United States Patent [19]

Nager, Jr.

[11] Patent Number: 4,833,775
[45] Date of Patent: * May 30, 1989

[54] ELECTRICAL CONNECTION APPARATUS FOR FLAT CONDUCTOR CABLES AND SIMILAR ARTICLES

[75] Inventor: Urs F. Nager, Jr., Bethel, Conn.

[73] Assignee: Burndy Corporation, Norwalk, Conn.

[*] Notice: The portion of the term of this patent subsequent to Apr. 18, 2006 has been disclaimed.

[21] Appl. No.: 642,725

[22] Filed: Aug. 17, 1984

Related U.S. Application Data

[63] Continuation of Ser. No. 367,487, Apr. 12, 1982, abandoned, and a continuation-in-part of Ser. No. 314,965, Oct. 26, 1981, abandoned.

[51] Int. Cl.$^4$ .............................................. B23P 19/04
[52] U.S. Cl. ..................................... 29/747; 29/432.1; 29/512; 29/853; 29/866; 174/71 R; 174/88 R

[56] References Cited

U.S. PATENT DOCUMENTS

| | | | |
|---|---|---|---|
| 916,026 | 3/1909 | Sasseman | 29/278 |
| 2,131,347 | 9/1938 | Fenton | 29/432.1 |
| 2,441,181 | 5/1948 | Bartelheim | 29/882 |
| 3,133,773 | 5/1964 | Ecker | 339/96 |
| 3,148,356 | 9/1964 | Hedden, Jr. | 29/852 |
| 3,193,921 | 7/1965 | Kaan | 29/512 |
| 3,221,095 | 11/1965 | Cook | 339/17 F |
| 3,252,493 | 5/1966 | Smith | 29/512 |
| 3,432,925 | 3/1969 | Woolley | 29/761 |
| 3,526,955 | 9/1970 | Cilione | 29/512 |
| 3,924,917 | 12/1975 | Munshower | 339/17 F |
| 4,015,328 | 4/1977 | McDonough | 339/17 M |
| 4,066,319 | 1/1978 | Baker et al. | 339/17 F |
| 4,253,226 | 3/1981 | Takeda | 29/432.1 |

FOREIGN PATENT DOCUMENTS

| | | |
|---|---|---|
| 073395 | 12/1979 | Japan . |
| 56-13739 | 3/1981 | Japan . |
| 57-48833 | 10/1982 | Japan . |
| 58-52623 | 11/1983 | Japan . |
| 1177275 | 1/1970 | United Kingdom . |

OTHER PUBLICATIONS

"Electronic Packaging and Production", Cabners/Kiver Publication, Jan. 1981.

*Primary Examiner*—P. W. Echols
*Attorney, Agent, or Firm*—Perman & Green

[57] ABSTRACT

Electro-mechanical connections for flat conductor cables and similar articles are produced with flanged hollow rivets which puncture the cable or cables to be connected and then are compressed into an eyelet configuration which clamps and is secured to the cable. Apparatus and procedures for achieving this result are disclosed.

13 Claims, 6 Drawing Sheets

FIG. 1a.
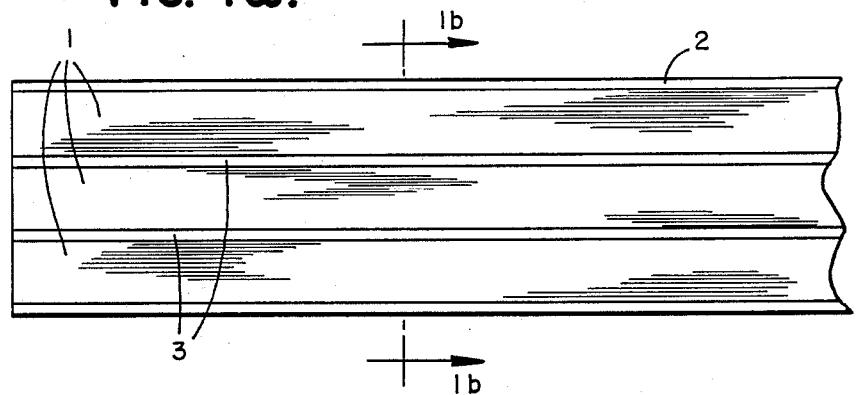
FIG. 1b.
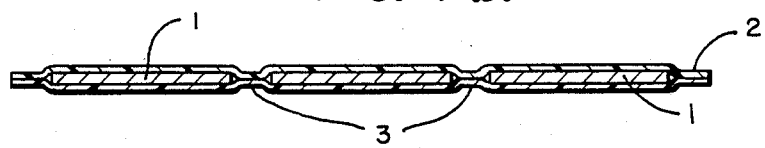
FIG. 2a.
FIG. 2b.
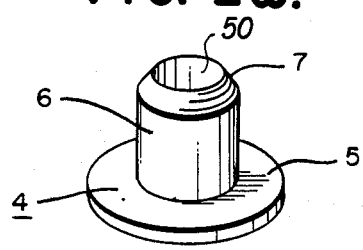
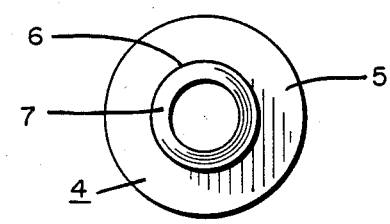
FIG. 3a.
FIG. 3b.
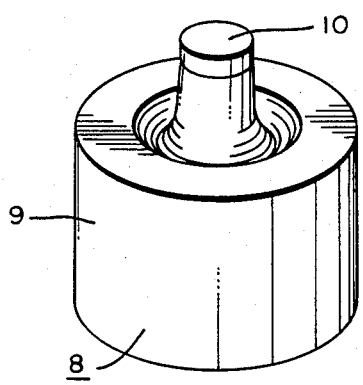
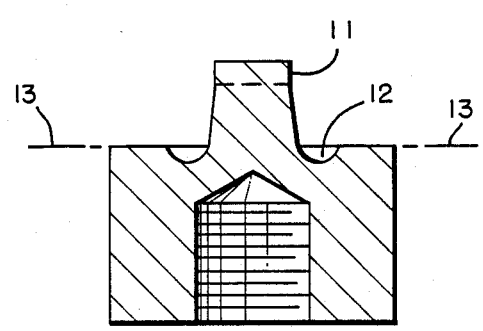

ELECTRICAL CONNECTION APPARATUS FOR FLAT CONDUCTOR CABLES AND SIMILAR ARTICLES

RELATED APPLICATIONS

This application is a continuation of U.S. patent application Ser. No. 367,487, filed Apr. 12, 1982, now abandoned, which is a continuation-in-part of U.S. patent application Ser. No. 314,965, filed Oct. 26, 1981, now abandoned, all applications assigned to the Burndy Corporation.

BACKGROUND OF THE INVENTION

This invention relates to conductive connectors for electrically joining two or more conducting elements, such as a flat conductor cable. This invention further relates to such connectors which function to mechanically secure the conducting elements together at the point of junction.

Flat conductor cables have found acceptance in wiring applications wherein conventional round rubber or plastic-coated wires are undesirably visible due to their location and/or the need for a multitude of wiring connections, such as in an office environment. For example, wires which must traverse a room space are variously hidden within the walls, or tacked to baseboards, or placed under the carpeting. Flat conductor cables solve these problems by being locatable under carpeting or tiling without causing objectionable bulging. They accordingly also eliminate the need in many wiring applications for extensive behind-the-wall electrical installation. In new building construction, duct-work is usually built into the walls and floors of the building going up in order to accommodate conventional wiring. Therefore, if the choice is made to use flat conductor cables instead of conventional wiring, the inconvenience of including the duct-work at the construction stage is eliminated.

Additionally, this type of cable wiring permits renovations of older buildings having conventional wiring to be made with much more ease. Since the cable wiring may be placed beneath carpets, the new work may be performed by simple connecting by means of transition connections cable wiring with the older, more conventional wiring already in place in the building.

As is known, flat conductor cables comprise multiple strips of very thin conductive material, such as copper, separated from each other in a thin insulating sleeve made from a rubber or a plastic material, for example, polyester. Various thicknesses or gauges are known, with the metal strip being generally about as thick as the top and bottom plastic coverings combined, for example, about 6 to 10 mils. A given cable can comprise from several to a large number of metal strips; the width of a given metal strip will vary from cable to cable, and can generally range from about 0.6 to about 1 inch.

Flat conductor cables can and in many cases must be tapped, spliced, or connected to transition junctions or service modules. A transition junction is simply a connection between a portion of a flat conductor cable wiring system and a conventional wiring system. A service module is a box from which power may be tapped from a flat conductor cable wiring system for direct use by the consumer; a common example of which is a simple electrical outlet. Whereas the insulation of round wires is cut and stripped from the wire to achieve these types of connections, flat conductor cables are joined together by clamp connectors with teeth which typically either project all the way through the cable sandwich of plastic-conductor-plastic, and then into the conducting element to which the cable is to be joined, and then to the other side of the clamp, or they are joined by clamp connectors which penetrate just down to the conductive strip of the cable. The openings through which the connectors are fitted are generally produced by pre-punching the cable with a suitable device to produce the proper size opening for the connector. The procedure generally requires special alignment fixtures to insure that the locations of all taps, splices and other connections are correct.

In the current under-carpet wiring installations which are sold commercially, several different types of clamp connectors must be used depending on the type of connection being made; that is, whether the connection is a tap, splice or transition connection. Once the several steps precedent to the installation of the clamp are accomplished, the clamps are secured to the cable with a gripper tool which is manually operated by the installer.

There is therefore a need for a simple procedure for effecting an electrical connection between flat conducting articles such as cables, and another conducting element, which may be another cable or, for example, a service module or transition connection. Where the connection is to be made on the site of the installation, it is highly desirable that this procedure be accomplished quickly, with a minimum amount of equipment, and with equipment which is relatively portable in nature and easy to handle. Further, because of the inherent advantage of the cable structure, it is desirable that the connections conform as much as possible to the flat cable geometry. In other words, the advantages of the cable wiring are reduced considerably if taps, splices and other connections result in bulky projections of the wiring system.

It is further more desirable to provide a flat conductor cable installation system which makes use of one type of connector for all of the various types of connections which must be made. It would additionally be advantageous to provide such a system in which the electro-mechanical connection can be made more physically secure through the imposition of greater amounts of force while retaining excellent electrical connection between the conductor strips of the cable and the connector element itself.

Safety considerations require that all flat conductor cable wiring be protected with an outer shield of grounding metal, such as cold-rolled steel. This shielding is flat and strip like, as is the cable itself, and averages about 10 mils in thickness. When connections of various types are made with the cable itself, the shielding must frequently be spliced and redirected to follow the operations being performed on the flat conductor cable. It would thus be of further advantage to be able to use the connection arrangement and procedure for flat conductor cables to connect various strips of shielding as well. Since the shielding is electrically conductive, such connections would also have to be electro-mechanical and secure in nature.

SUMMARY OF THE INVENTION

This invention addresses the aforementioned needs and improves flat conductor cable technology by providing an arrangement and procedure for quickly and conveniently electro-mechanically securing a connection for a flat cable or similar article to another conducting element, making use of equipment which is portable and which produces a strong connection substantially conforming to the flat cable geometry.

The connecting arrangement or apparatus of this invention comprises an electrically conductive flanged malleable or compressible hollow rivet connector, anvil means for cold-forming the rivet connector into an eyelet configuration, and compression means for registering and forcing the rivet connector through a flat conductor cable into contact with the anvil means so as to form an electro-mechanically secure eyelet/flange connection. The connection procedure of this invention requires that the rivet connector possess a hollow pin or post adapted to fit around and over the top portion of a vertical stud on the anvil means. The geometry of the anvil means is such that, after the rivet connector has been forced through the cable structure and over the top of the anvil post, continued movement of the rivet over the anvil post and onto the anvil base forces the hollow post of the rivet to expand outward and eventually to curl or roll around the other side of the opening formed in the cable or cables to be connected, such that an eyelet is formed which clamps the cable structure toward the flange of the rivet.

Where the electrical conduction system is to be subjected to high temperature or stress conditions, the rivet connector of this invention may be provided with a plurality of pointed lance-like members, extending in the same general direction as the hollow post extends, which are adapted to puncture the conductive cable structure as the post is forced through said structure. The lances provide enhanced electrical and mechanical strength to the overall connection. Preferably, the lances are equidistantly-spaced around the flange of the rivet, and are equally-spaced from the base of the post.

DESCRIPTION OF THE DRAWINGS

FIG. 1a is a top plan view of a typical flat conductor cable;

FIG. 1b is a front cross-section of such a cable.

FIG. 2a is a perspective view of a preferred embodiment of the rivet connector of this invention;

FIG. 2b is a top plan view of same looking toward the base or flange portion.

FIG. 3a is a front perspective view of a preferred embodiment of the anvil means of this invention;

FIG. 3b is a front cross section of same.

DETAILED DESCRIPTION OF THE INVENTION

Figure 4:
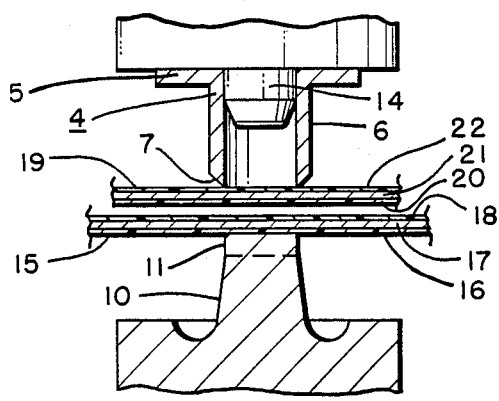
FIG. 4 illustrates the electrical connecting arrangement of this invention just prior to commencement of a procedure for joining two conductor cables.

The connection arrangement or apparatus and procedure of this invention, while capable of broader mechanical application, is specifically designed to be used with flat conductor cable systems. FIGS. 1a and 1b illustrate one example of such a cable. Thin strips of conducting material 1, such as copper, are embedded in, or adheringly surrounded by a thin sleeve 2 of an insulating plastic material, for example, a polyester. The metal strips 1 are separated and insulated from each other by spacings 3 at the edges of the cable and between the metal strips. The top and bottom plastic portions of the sleeve are simply bonded to each other at these points. FIG. 1b is an illustration of the cross-section of such a cable with the dimensions of the components somewhat exaggerated for easier illustration. An example of 3-strip flat conductor cable is a Type FCC 12 AWG, 300 volt, 20 amp copper cable sold by Burndy Corporation. As a dimensional example, the thickness of this specific cable is approximately 15 mils across a conductor strip, the copper strip itself being approximately 7 mils, and the insulating plastic being approximately 4 mils at the top and at the bottom. Of course, at the spacings 3 the overall width decreases to about 8 mils of plastic. In any event, the connection arrangement and procedure of this invention is not limited in its scope to any specific gauge or thickness of conductor cable.

As before stated, this invention makes use of a flanged electrically-conductive malleable or compressible rivet connector, a preferred structure of which is illustrated in FIGS. 2a and 2b. The rivet connector 4 consists of a thin disc-shaped flange or base 5 and a vertical post 6. The post 6 and indeed the connector 4 is hollow, wherein the opening in the flange and the hollow or inner diameter of the post are equal. A preferred feature of the connector of this invention is that the post 6 is tapered at or near the top as shown to form a wedge. The tapered portion 7 slopes from the top of the post outward toward the flange portion of the rivet connector. The wedge feature is designed to assist a suitable puncturing and expansion of the flat conductor cable during the connection procedure. This will be described in more detail below. The dimensions of the connector are not critical per se, however, having selected specific types of conducting elements to connect, the practitioner of this invention will find that a preferred range of dimensions works best. Thus, for example, using the specific type of conductor cable mentioned above, it has been found that excellent connections are produced with a rivet connector having the following dimensions: inner diameter (hollow diameter) of about 166 mils; post wall thickness of about 25 mils; total height of about 248 mils; and a flange diameter of approximately 430–440 mils.

The material of construction of the rivet connector must be compressible or malleable under force in order to be cold-formable into the eyelet shape desired at the end of the procedure. Additionally, of course, the material is preferably electrically conductive to approximately the same extent as the conductivity of the metal strips 1. Obviously the easiest way to match conductivities is to use the same materials; therefore, for copper flat conductor cable it is preferred that the connector element be comprised of copper or a copper alloy. To enhance the connecting procedure, and to reduce or eliminate any tendency for the connector material to adhere to the anvil means, and also for ease of removal of the completed connector from the anvil means, it is preferred that the surface of the connector be coated with lubricating or smooth inorganic or organic material. Suitable materials would include paraffin or smooth metal such as tin or combinations of these.

The exact degree of taper of the wedge at the top of the rivet post is not critical in and of itself, any may in fact vary depending upon the type of flat conductor cable undergoing the connection procedure. Generally however, angles of 40 degrees to 50 degrees have been found to achieve the desired results.

FIGS. 3a and 3b illustrate the anvil means of this invention, which corresponds to the rivet embodiment of FIG. 2, the shape and construction of which is considered very important for proper functioning of this invention. This anvil 8 is comprised of a hard pressure-resistant material, such as a polished steel and the relative motion which occurs between the rivet connector 4 and the anvil 8 causes the connector to be formed into the final desired eyelet shape. In a preferred compressing device, designed for use with the foregoing connector, and which is described and claimed in detail in copending U.S. patent application Ser. No. 314,966 filed Oct. 26, 1981, assigned to Burndy Corporation, and entitled, APPARATUS AND METHOD FOR INSTALLING ELECTRICAL CONNECTORS ON FLAT CONDUCTOR CABLE, the anvil means 8 is held stationary with respect to the movement of the compressing means and connector. However, it is not critical to this invention which of the connector and anvil means moves with respect to the other. It is the thrusting movement and registration of the one toward the other that is important.

The anvil 8 consists of a relatively thick, disc-like base 9, to which is attached a generally vertical post 10. The upper portion 11, shown extending from the top of post 10 down to the dashed line, is perpendicular with respect to the base and the post thereafter is gently tapered outward until it reaches the base. At that point, the post opens up into a curved, circular well 12 formed in the base. Specifically referring to FIG. 3b, line 13—13 represents the top surface of the anvil base 9, and is shown passing over well 12 and through post 10 for purposes of reference. It is seen that the well 12 is generally of U-shape, and it is clear from FIGS. 3a and 3b that the well surrounds the post 10 where it is connected to the base 9.

The slight outward tapering of anvil post 10 which occurs below upper portion 11 serves several purposes. The taper forces the malleable rivet post placed thereover to expand in an outward direction, such that when the tip of the rivet post reaches well 12, it will begin to expand further outward and around the puncture made in the cable to form the eyelet. Additionally, as the rivet post forces the cut cables ahead of it, the anvil post taper controls the descent of the cables such that the expanding rivet post and the cut cables arrive in the well in proper placement and timing. Further, since there is friction between the cut cable or cables and the tapered portion of the anvil post, it has been found that this friction exerts a cleaning or polishing effect on the conductive strips of the cables to enhance the quality of the electrical connection which is about to be made.

As with the dimensions of the rivet connector 4, the dimensions of the anvil means are not critical in and of themselves. They will depend in large measure upon the parameters selected for the conducting cables or other articles to be joined, the dimensions and materials of construction of the rivet connector to be utilized, and the compressing forces to be used to effect puncture and connection. As an example, using the specific flat conductor cable referred to above, and the specific dimensions given for the copper rivet connector, it has been found that the following anvil dimensions produce excellent connections when utilized with compression forces of about 2000 to 3500 pounds: diameter of the anvil base of about 624 mils; height of the base from the bottom to line 13—13 of about 375 mils; height of the anvil post from line 13—13 to the top of about 174 mils; diameter of the upper, non-tapered portion of the anvil post of about 163 mils; length of post portion 11 of about 44 mils; the angle of outward taper of the anvil post is approximately 2.5° from the normal; the distance from line 13—13 to the bottom of well 12, or in other words the depth of the well is about 19 mils; and the distance across the top of the well from the side of the post to the other side of the well along line 13—13 is from about 38–44 mils.

The sequence of cable puncturing and electromechanical fixation utilizing the rivet connector of FIG. 2, will now be described with reference to FIGS. 4–7. First with respect to FIG. 4, a ram portion 14 of a suitable compression means, such as the means described in the above referred to pending application, holds and registers the rivet connector 4 above anvil means 8 such that the post 6 of the rivet is perfectly concentric with the post 10 of anvil 8. Resting on top of the anvil for purposes of this illustration, are portions of two flat conductor cables which are to be electrically connected, as would occur in a tapping or splicing operation, by the rivet connector 4. Both portions of the two cables contain of course, a conductive metal strip since the object is to electro-mechanically connect the two cables. Therefore, the portion of flat conductor cable 15 resting immediately on anvil 8 comprises a bottom plastic insulating layer 16, a layer of copper conductor 17, and a top layer of insulating plastic 18. Directly above cable 15 is another flat conductor cable 19, the portion immediately over the anvil comprising a bottom plastic layer 20 adjacent to plastic layer 18, a middle copper strip 21, and an upper plastic insulating layer 22.

Figure 5:
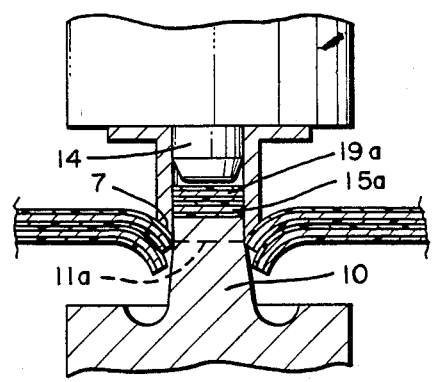
FIG. 5 illustrates the cable puncture phase of the connection procedure.

Referring now to FIG. 5, ram 14 of the compressing means has moved the rivet connector 4 down forcibly against cables 15 and 19. In so doing, the cables have been ruptured and post 6 of rivet connector 4 has slid over the top portion of post 10 of anvil 8. It should be recalled that the inner diameter of the rivet post is just slightly larger than the diameter of the upper portion 11 of the anvil post. This swift downward action results in a rupturing of cables 15 and 19 due to the combined forces of the wedge feature 7 of rivet post 6 and the close resistance fit between the rivet post and the anvil post. Cable portions 15a and 19a are the circular cut out portions caused by this puncturing action. The puncturing is actually completed well before the leading edge of the rivet post has reached the tapered portion of anvil post 10, and it can be seen that the puncturing action of the rivet post also drives the cut portions of cables 15 and 19 before it, down along the anvil post and towards well 12.

Figure 6:
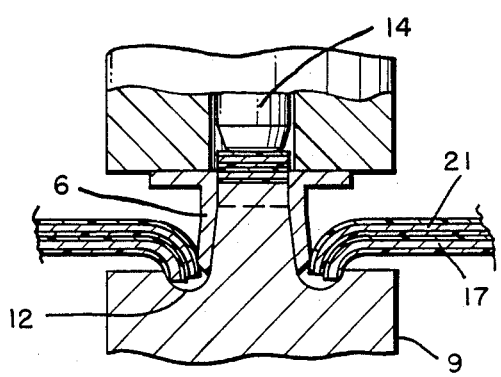
FIG. 6 illustrates the initiation of the cold-forming of, and eyelet formation from, the rivet connector.

Referring now to FIG. 6, as the downward stroke of the compression means continues, the leading edge of post 6, still driving the cut portions of the cables ahead of it, enters the tapered area of anvil post 8 and is spread outward as a result thereof. As the leading edge continues and encounters well 12, cold forming of post 6, as defined by the shape of the well, commences.

Figure 7:
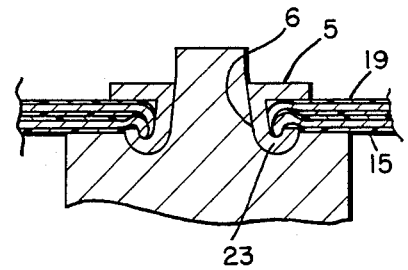
FIG. 7 illustrates the completion of eyelet formation and electro-mechanical connection.

Referring now to FIG. 7, the compression stroke continues to the end, and forces the post 6 of the rivet connector 4 to expand into a rounded eyelet 23, which curls under around and up to clamp the cable sandwich on the underside of 15 in the direction of the flange 5. The downward movement of the cut portions of the cables 15 and 19 is limited by their physical length, and as the post 6 continues to expand around the well, the rivet post material overcomes the advance of the cut portions of the cables which snap up into the enclosure formed by the eyelet and flange portions of the rivet connector. Therefore, together the eyelet portion 23 and the flange 5 form a pinch clamp to mechanically secure the connection and it can be clearly seen that the conductor strip portions 17 and 21 of cables 15 and 19 are in intimate contact with the inside of the eyelet, thus producing an excellent electrical connection.

As before mentioned, any suitable compression means for forcing the hollow post of the connector over the top of the anvil post, will suffice. Compression forces of between about 2000 and 3500 pounds produce excellent results with the rivet connector shown in FIG. 2. Again reference is made to the above mentioned copending U.S. patent application, of Burndy Corporation Ser. No. 314,966, filed Oct. 26, 1981, the entire contents of which are hereby expressly incorporated herein by reference.

Figure 8A:
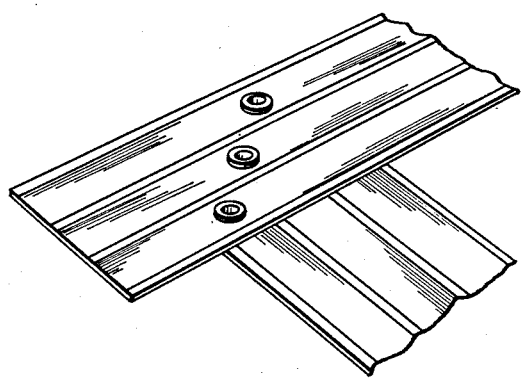
FIG. 8a is a plan view of a finished tapping connection shown from the flange side of the connector.
Figure 8B:
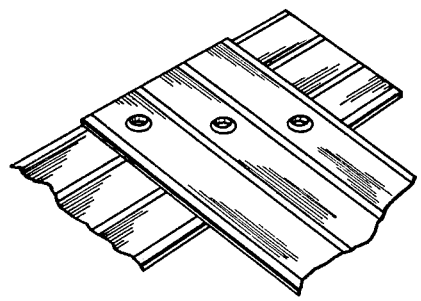
FIG. 8b is a plan view of the other side of the connection.

Referring to FIG. 8a, a finished tap connection of two flat conductor cables accomplished by the connection apparatus of this invention is illustrated, looking at the flange side of the connector shown in FIG. 2. FIG. 8b illustrates this connection from the other side, that is, the eyelet side of the connector. The connector is of course hollow.

Figure 9A:
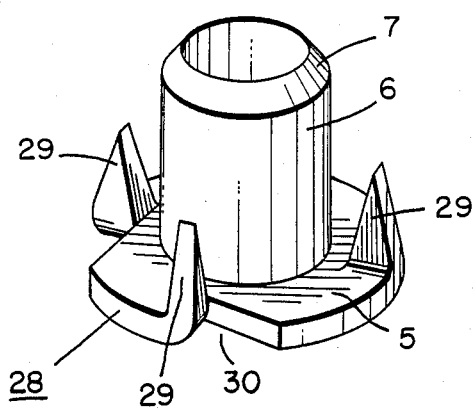
FIG. 9a is a perspective view of the alternate preferred embodiment of the rivet connector having the plurality of lances around the flange.
Figure 9B:
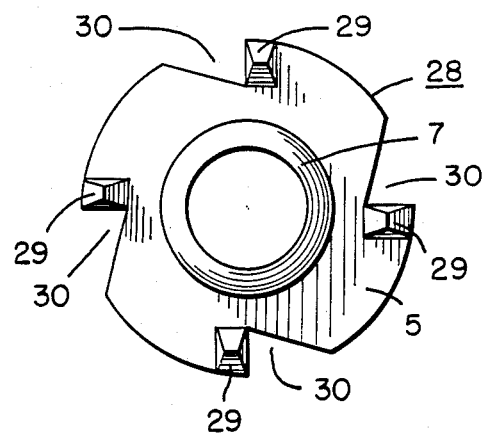
FIG. 9b is a top plan view of same looking toward the base or flange portion.
Figure 9C:
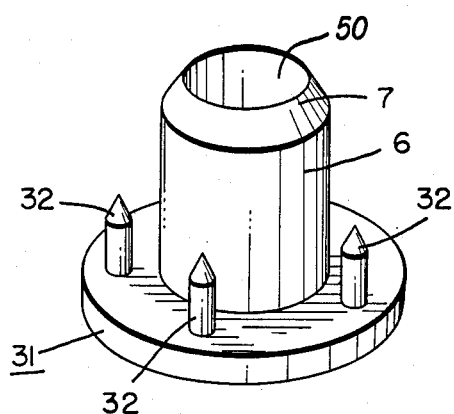

Alternate preferred embodiments of the rivet connectors of this invention are illustrated in FIGS. 9a–9c, according to which a plurality of pointed lances are provided around the flange and are adapted to puncture a cable or cable arrangement on which it is desired to effect an eyelet/flange connection as herein described. There are flat conductor cable systems which may be subjected to higher than normal electrical or mechanical stress, such as by very high power surges which cause cyclical contraction and expansion of the eyelet connector or the cable materials themselves. It is not uncommon that such perturbations result in a loosening of the connection around the eyelet clamp. This is undesirable for it increases the resistance of the connection and results in potentially unsafe operating conditions. Thus the rivet connector of this invention can optionally be provided with lances which will penetrate the cable when the rivet is forced therethrough, producing an even stronger mechanical and electrical connection as will now be described.

Referring to FIGS. 9a and 9c, two preferred rivet connectors are illustrated having lance members. The most preferred of the two is shown in FIG. 9a, wherein the lances are formed from the material of the rivet by tooling or otherwise forcing sections of the flange downward in the same orientation as the post. In the version shown in FIG. 9c, the lances are small diameter conductive rods which are, for example, mounted securely in the flange by any suitable method which provides the requisite column support for the rods. It has been found that small copper rods of a diameter of about 30–35 mils, which are press-fitted into smaller openings in the flange, give good results in the connection procedures described herein.

Reference will now be made to the rivet connector illustrated in FIGS. 9a and 9b.

As with the rivet connector previously described, connector 28 comprises the disc-shaped flange or base 5 and the vertical post 6. As before, the top of the post 6 is tapered to form the wedge 7. All of the other characteristics of the connector 28 are essentially the same, such as materials of construction, shape and geometry, as the connector 4, save for the provision of lance members 29. As shown in FIGS. 9a and 9b, the lances are spaced around flange 5 and four in number. It is considered important that there be at least two lances in this rivet embodiment, preferably three, and most preferably more than three. It is preferred, but not critical, that the lances be spaced equidistantly around the flange 5, and that they be spaced uniformly from the base of the post 6. Preferably, the length of the lances, as measured from the post side of the flange to the tip of the lance, is less than about half the length of the post. In the instance of the rivet connector previously described, good results are obtained where the lances are between about 105 and 115 mils in length. The same is true of the connector 31 and lances 32 shown in FIG. 9c.

The lances of connector 28 may be formed by any suitable tooling method, and may be joined or fastened to the flange 5 in a manner which will provide the necessary column support for the lances during the puncture phase of the connection procedure. A preferred method, resulting in the structure illustrated in the drawings, utilizes a cutting tool having graduated triangular grooves along the shaft. When forced down over the connector shown in FIG. 2, for example, pie-shaped sections of the flange 5 are cut and forced downward in the same direction as the post 6. The sharp-edged lances 29 are thus formed from the material of the connector 28 itself. As before stated, any suitable tooling method of the many known to the art may be utilized. The important aspect is to provide lances with relatively sharp ends which, when the rivet is forced through the cable arrangement, will not only puncture the structure, but will force, or wedge, the cable material aside its length to increase the strength and contact of the connection. In the case of the connector 31 with the rod-like lances 32, the wedge of the lances is of circular cross-section, while in the more preferred connector 28, the lances 29 have a pie-shaped wedge as they will puncture the cable. This is perhaps best seen from the top plan view of FIG. 9b.

Figure 10A:
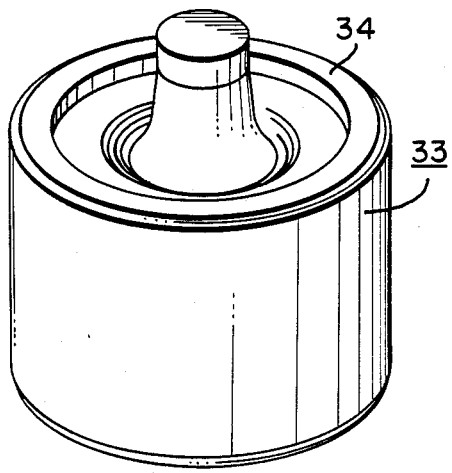
FIG. 10a is a front perspective view of the anvil means adapted for use with the connector of FIG. 9.
Figure 10B:
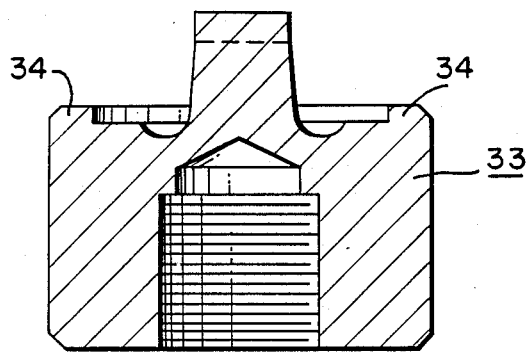
FIG. 10b is a front cross-section of same.

The anvil means 33 illustrated in FIGS. 10a and 10b, is adapted for use with the lanced connectors from the basic design of the anvil 8 shown in FIG. 3. Anvil 33 is provided with a circular ridge 34, which is preferred for purposes of bracing the cable arrangement during the puncture phase of connection with a lanced rivet. Otherwise, the characteristics, materials, geometry and dimensions are essentially the same as for anvil means 8. The ridge 34 is preferably about 30 mils in height as measured from line 13—13 to the top of the ridge, and is approximately 50-55 mils across its top.

Figure 11:
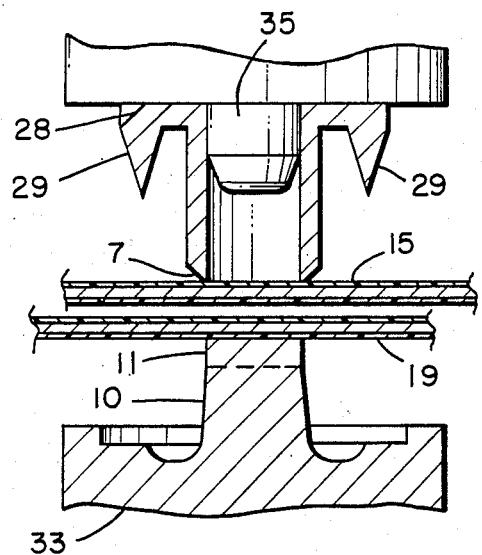
FIGS. 11 through 14 correspond to the connection sequence shown in FIGS. 4 through 7, wherein however the rivet connector is the one pictured in FIG. 9 above.

Employing FIGS. 11 through 14, the sequence of cable puncturing and electro-mechanical connection using the lanced connector 28, will now be described. In FIG. 11, a ram 35 of a compression means, an especially preferred apparatus for which is claimed and disclosed in U.S. patent application Burndy Docket #9163E, filed of even date with this continuation-in-part application, holds and registers the rivet connector 28 above the anvil 33 such that again the post 6 of the rivet is concentric with the post 10 of anvil 33. The entire contents of the Burndy patent application Docket #9163E are hereby expressly incorporated herein by reference. As in the connection sequence shown in FIGS. 4–7, this sequence uses the example of joining two flat conductor cables 15 and 19. In FIG. 11 therefore, the tapered portion 7 of connector 28 has just made contact with cable 15.

Figure 12:
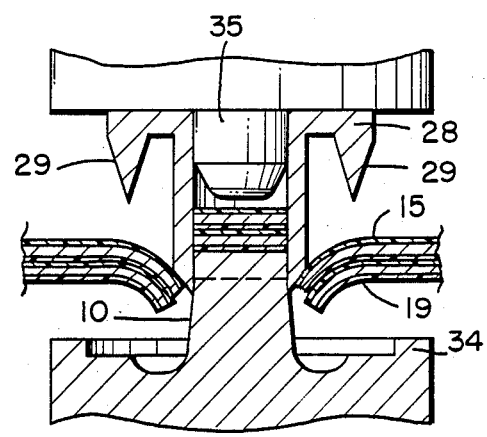

Referring to FIG. 12, ram 35 of the compressing device has thrust the rivet 28 downward cutting or puncturing the cables 15 and 19, similar to the action and with the same results shown in FIG. 5. At this point, the lances 29 have not yet penetrated the cables, since the wedge action of the connector 28 has forced the cables 15 and 19 downward over the anvil post 10 and ahead of the descending rivet.

Figure 13:
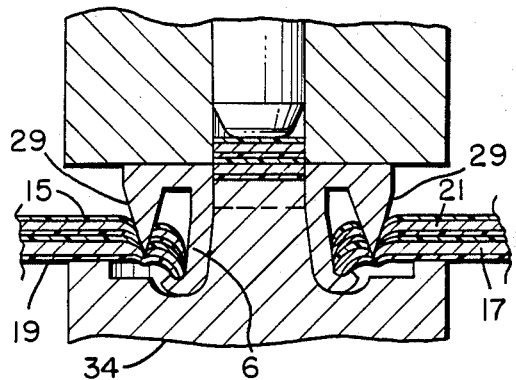

Referring to FIG. 13, similarly to the process shown in FIG. 6, the downward stroke of the compression means has caused cold forming of the rivet post 6 into the beginning of eyelet formation. By now, however, the leading edges of the lances 29 have been driven at least partially through the cable sandwich, making electrical contact with the cable copper strips 17 and 21.

Figure 14:
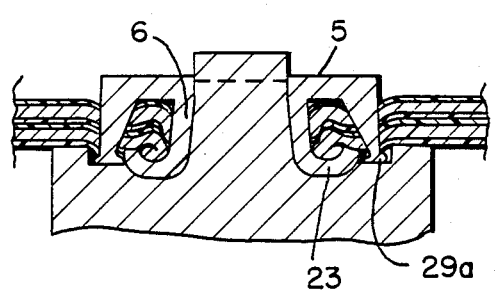

As the downward stroke continues to the end in FIG. 14, as in FIG. 7, the post of the rivet is formed into an eyelet 23, clamping the cable structure between it and the rivet flange 5. The lances 29 have completely penetrated the cables, and the force of the rivet against the anvil surface has just slightly blunted the ends 29a of the lances. It is preferred that, at the end of the puncturing process, the ends 29a of the lances protrude at least partially through the other side of the pieces being connected. Using the dimensions of the connectors and anvils described herein, it will be seen that, as the post 6 of the connector is rolled into the eyelet shape, the lances will be slightly bent outward from the anvil and rivet posts by the forming eyelet.

The result is an even stronger electrical and mechanical connection than with the connector of FIG. 2, for those applications in which greater than normal electrical or mechanical stress is placed on the flat cable system. The disadvantage is of course primarily in the added cost of manufacturing connectors with lance members. Therefore, the operating conditions to which the conductor system will be subjected will determine which type of connector 4, or 28, will be used.

The dimensions of the lances 29 are not critical per se; however, using the dimensions of the connectors described herein, lances 29 of connector 28 are preferably 65 to 70 mils wide at the base of the lance at the flange 5, and gradually taper to a point over the length of the lance, which is about 115 mils from flange to tip. The thickness of the lance will generally be about the thickness of the flange 5 where the lance is formed from the material of the connector itself. It has been found that best results are obtained with lanced rivets when the total height of the rivet is greater than that of the rivet shown in FIG. 2. Thus, the rivet of FIG. 9 is preferably about 300 mils in height.

Figure 15A:
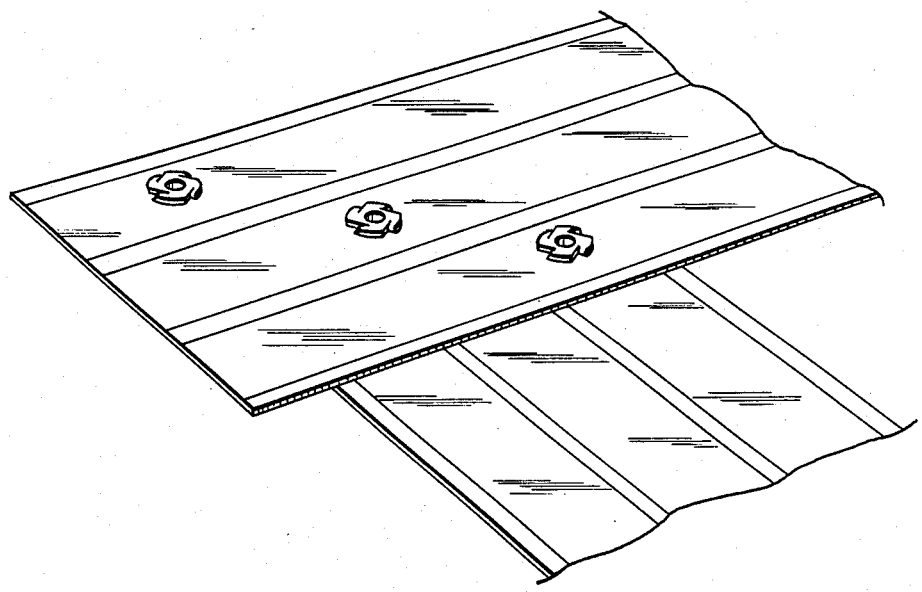
FIG. 15a is a plan view of a finished tapping connection shown from the flange side of the connector of FIG. 9.
Figure 15B:
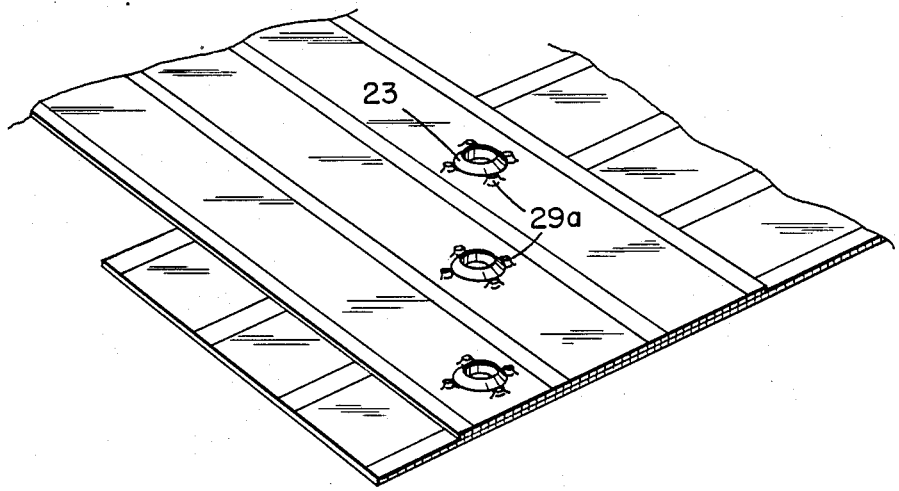
FIG. 15b is a plan view of the other side of the connection.

Referring to FIGS. 15a and 15b, the tap connection shown in FIGS. 8a and 8b is again depicted, with however the connectors being of the lance type. FIG. 15a of course shows the tap from the flange side of the connectors, and 15b shows the connection from the eyelet side. Note the tops of the lances 29a protruding from the tap adjacent eyelets 23.

Although the connection apparatus and procedure of this invention has been described and illustrated with respect to the joining of two flat conductor cables, such as would occur in a tapping or splicing operation, this invention also embraces within its scope terminal or transition connections, in which the rivet connector is driven through and clamps the top and bottom portion of a single flat conductor cable, or in which the end of the cable is folded upon itself once and the connector driven through the folded over portion. The reason for the latter possibility is to insure good electrical connection by giving the connector two opportunities to pass through the cable.

Figure 16:
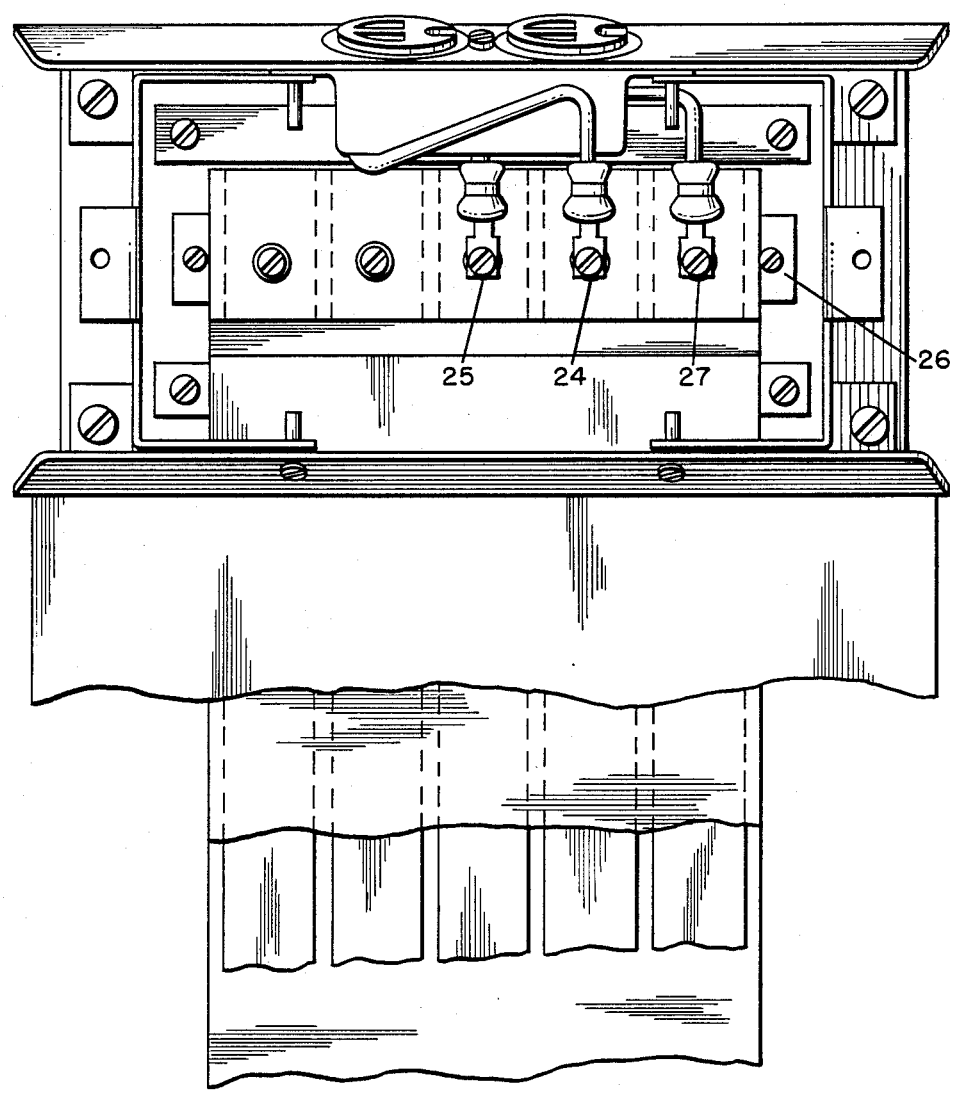
FIG. 16 illustrates the cable connection of this invention used with a screw and lug service module and the connector of FIG. 2.

A terminal or service module connection is illustrated in FIG. 16, in which proper sized screws 24 have been inserted through the hollow connector openings 25 and into a suitable insulating holding bar 26. The connector shown is the embodiment of FIG. 2. Then, for example, lugs 27 from an electrical outlet are placed between the screw and flange portion of the connector to achieve the terminal connection. Alternately, instead of lugs making the connection conventional round wires may be stripped and bent into curved shapes which would be inserted between the screw and flange as with the lugs illustrated. A transition connection would be accomplished in a similar fashion, since, at the transition junction, the cable to be connected is mounted generally on an insulating holding bar, and screws are then inserted into the connector openings similar to that depicted in FIG. 16. Obviously, the same arrangement would be used if the connector is the rivet embodiment in FIG. 9.

This invention can be utilized to produce electrical connections in other flat conductive articles as well. For example, the steel grounding shields which, as indicated above, are used with flat conductor wiring systems, may be electro-mechanically connected using the connectors and apparatus of this invention. Typically, the grounding shield strips are of about 10 mils thickness, and the procedure to utilize the rivet connectors of this invention to secure two such shield pieces together would be esentially the same as that detailed for cable connecting. It has been found however that the best electro-mechanical connections between two such conductive sheets of material are produced when a separation layer is placed between the two sheets to be connected. Conveniently enough for undercarpet wiring systems, a strip of fabric adhesive would be one example of a separating layer which works quite suitably. Generally, the separating layer which may also be a suitable plastic film, should be between 5 and 15 mils in thickness. The separation layer is believed to be responsible for the best eyelet formation when two metal strips are connected using the procedure and apparatus of this invention.

This invention is capable of use quite beyond the specific examples detailed herein, as will be apparent to practitioners in the relevant art. Although not described herein, such further applications for making electro-mechanical connections are deemed to be within the scope of this invention.

What is claimed is:

1. Apparatus for quickly and rapidly producing a strong electro-mechanical connection on a flat conductive article which comprises:
   a. an electrically-conductive compressible rivet connector, having a flange with a circular opening and a hollow cylindrical post circumferentially joined to the flange at said opening, the top of said post being tapered outward toward said flange, and having a plurality of lance members joined to, and spaced around the flange on the post side thereof and extending in the same direction as the post, said lance members being shorter than the post;
   b. anvil means comprising a base, a vertical circular post attached thereto, and a curved, circular well immediately surrounding said post at the anvil base, wherein the post is cylindrical at the top and thereafter uniformly tapered out toward the anvil base;
   wherein the inner diameter of the hollow rivet post is greater than the diameter of the top cylindrical portion of the anvil post, but less than the diameter of the tapered portion thereof;
   c. compression means for positioning and registering said rivet connector opposite said anvil means in post-to-post concentric facing relationship wherein said compression means forcibly thrusts said rivet post and lance members through a flat conductive article placed between the rivet connector and the anvil, said post member producing a cut-out portion from said flat conductive article, and over said anvil post whereby said rivet post is formed into an eyelet which clamps said flat conductive article between the eyelet and said rivet flange and said lance members penetrate said flat conductive article, to electro-mechanically secure the rivet connector to said flat conductive article.

2. The apparatus of claim 1 wherein the anvil means further comprises a ridge raised above the base, but lower than the post, spaced from and surrounding the curved, circular well.

3. The apparatus of claim 2 wherein the rivet connector comprised of a malleable metal or metal alloy.

4. The apparatus of claim 3 wherein the angle of taper at the top of the rivet connector post is between 40° to 50° from the vertical.

5. The apparatus of claim 4 wherein there are four lance members equally spaced around the flange.

6. The apparatus of claim 5 wherein the lance members are wedge-shaped.

7. The apparatus of claim 6 wherein the lance members are integral with, and formed from, the flange itself.

8. The apparatus of claim 1 further including a lubricant means on said connector.

9. The apparatus of claim 1 wherein there is friction between said flat conductive article and said anvil post which exerts a cleaning or polishing effect on said flat conductive article whereby the quality of the electrical connection is enhanced.

10. The apparatus of claim 1 wherein said electro-mechanical connection is produced on a plurality of flat conductive articles placed adjacent one another between said rivet connector and said anvil.

11. The apparatus of claim 1 wherein the difference between said inner diameter of said hollow rivet post and said diameter of the top cylindrical portion of the anvil post is in the order of 0.003 inches.

12. The apparatus of claim 1 wherein said lances have sharp ends.

13. The apparatus of claim 1 wherein the ends of said lances are slightly bent outward of said anvil and rivet post portions.

* * * * *